United States Patent [19]

Jamoua et al.

[11] Patent Number: 5,063,516
[45] Date of Patent: Nov. 5, 1991

[54] SMART POWER DRIVER SYSTEM FOR A MOTOR VEHICLE

[75] Inventors: Saad A. Jamoua, Oak Park; Melvin J. Sarnowsky, Livonia, both of Mich.; Karl R. Heck, Pheonix, Ariz.

[73] Assignee: Ford Motor Company, Dearborn, Mich.

[21] Appl. No.: 396,206

[22] Filed: Aug. 21, 1989

[51] Int. Cl.⁵ .............................................. G01R 31/02
[52] U.S. Cl. .............................. 364/431.11; 364/483; 340/635
[58] Field of Search ....................... 364/431.01, 431.03, 364/431.04, 431.11, 424.03, 424.04, 551.01, 550, 481, 483; 123/479, 490; 73/119 A; 361/88, 93, 152, 160; 371/15.1, 16.5, 29.1; 324/422, 522, 523; 340/635, 644, 653

[56] References Cited

U.S. PATENT DOCUMENTS

| | | | |
|---|---|---|---|
| 4,214,308 | 7/1980 | Carp | 364/431.11 |
| 4,412,328 | 10/1983 | Homa | 371/15.1 |
| 4,479,161 | 10/1984 | Henrich et al. | 123/490 |
| 4,587,615 | 6/1986 | Takahashi | 364/431.11 |
| 4,589,401 | 5/1986 | Karim et al. | 123/479 |
| 4,618,954 | 10/1986 | Otobe et al. | 371/16.5 |
| 4,635,214 | 1/1987 | Kasai et al. | 364/551.01 |
| 4,736,267 | 4/1988 | Karlmann et al. | 123/490 |
| 4,764,884 | 8/1988 | Noyori | 364/431.11 |
| 4,821,562 | 4/1989 | Inoue | 73/119 A |
| 4,932,246 | 6/1990 | Deutsch et al. | 73/119 A |

OTHER PUBLICATIONS

Siemens, "SMT 12 SMART-SIPMOS® Intelligent Monolithic Power Switch", pp. 1-6, issued by Colorado Components Division, 10/85.

*Primary Examiner*—Parshotam S. Lall
*Assistant Examiner*—Michael Zanelli
*Attorney, Agent, or Firm*—Allan J. Lippa; Peter Abolins

[57] ABSTRACT

An electrical power driver system with fault monitoring provision for both a self test mode and a normal operating mode. During the self test mode, the power driver is momentarily actuated during test intervals and its output compared to a predetermined value for providing self test fault indications. Each power driver is sampled and an indication provided of whether the fault is new or old in addition to providing a count of faults. During normal operation, monitoring circuitry provides indications of a plurality of fault types including over temperature, open circuit, short to ground, and short to voltage. A determination is made of whether each fault type is new or old and a count of faults provided. Output formatting provides indications of fault type, fault count, and whether the fault is intermittent or hard.

4 Claims, 10 Drawing Sheets

| | | |
|---|---|---|
| $OCC_1$ | $COC_1$ | —176 |
| $OCC_2$ | $COC_2$ | —178 |
| $OCC_3$ | $COC_3$ | —180 |
| $OCC_4$ | $COC_4$ | —182 |
| $OCC_5$ | $COC_5$ | —184 |
| $OCC_6$ | $COC_6$ | —186 |
| $OCC_7$ | $COC_7$ | —188 |
| $OCC_8$ | $COC_8$ | —190 |

| | | |
|---|---|---|
| $STVC_1$ | $CSTV_1$ | —236 |
| $STVC_2$ | $CSTV_2$ | —238 |
| $STVC_3$ | $CSTV_3$ | —240 |
| $STVC_4$ | $CSTV_4$ | —242 |
| $STVC_5$ | $CSTV_5$ | —244 |
| $STVC_6$ | $CSTV_6$ | —246 |
| $STVC_7$ | $CSTV_7$ | —248 |
| $STVC_8$ | $CSTV_8$ | —250 |

| | | |
|---|---|---|
| $STGC_1$ | $CSTG_1$ | —206 |
| $STGC_2$ | $CSTG_2$ | —208 |
| $STGC_3$ | $CSTG_3$ | —210 |
| $STGC_4$ | $CSTG_4$ | —212 |
| $STGC_5$ | $CSTG_5$ | —214 |
| $STGC_6$ | $CSTG_6$ | —216 |
| $STGC_7$ | $CSTG_7$ | —218 |
| $STGC_8$ | $CSTG_8$ | —220 |

| | | |
|---|---|---|
| $OTC_1$ | $COT_1$ | —266 |
| $OTC_2$ | $COT_2$ | —268 |
| $OTC_3$ | $COT_3$ | —270 |
| $OTC_4$ | $COT_4$ | —272 |
| $OTC_5$ | $COT_5$ | —274 |
| $OTC_6$ | $COT_6$ | —276 |
| $OTC_7$ | $COT_7$ | —278 |
| $OTC_8$ | $COT_8$ | —280 |

| HARD FAULT ||
|---|---|
| INJECTOR NO. | FAULT TYPE |
| ⋮ | ⋮ |
| INJECTOR NO. | FAULT TYPE |
| ⋮ | ⋮ |
| INJECTOR NO. | FAULT TYPE |

| INTERMITTENT FAULT ||
|---|---|
| INJECTOR NO. | FAULT TYPE |
| FAULT COUNT ||
| ⋮ | ⋮ |
| INJECTOR NO. | FAULT TYPE |
| FAULT COUNT ||
| ⋮ | ⋮ |
| INJECTOR NO. | FAULT TYPE |
| FAULT COUNT ||

SMART POWER DRIVER SYSTEM FOR A MOTOR VEHICLE

BACKGROUND OF THE INVENTION

The field of the invention relates to electrical power drivers with fault monitoring provisions.

Electrical power drivers commonly employ a switching transistor coupled between a voltage source and a load such as an electronically actuated fuel injector. In response to an actuating signal, the switching transistor couples the voltage source to the load through its dynamic impedance. Various attempts have been made to incorporate diagnostics with the power driver. For example, U.S. Pat. No. 4,589,401 issued to Karim et al discloses a power driver having diagnostic capability. Current sensing through the load is coupled to a microcomputer for inferring either short circuit or open circuit fault conditions. More specifically, when current is detected during the absence of an actuating signal, the microcomputer infers a short circuit condition. Similarly, when current is not sensed during an actuating signal, the microcomputer infers an open circuit condition.

Another example of a power driver having some form of fault diagnosis is provided by a Siemens device designated as SMT 12 SMART-SIPMOS TM. Sensing circuitry is coupled to a FET transistor for providing indications of open circuit, short circuit, over temperature, and under voltage conditions. These fault indications are provided on a status output pin by toggling the input and monitoring changes in status output. Additional external circuitry is required to infer the fault type from the input changes and the corresponding changes in status output.

The inventors herein have recognized numerous disadvantages with the fault detection approaches described above. For example, the inventors herein contend that these prior approaches do not provide a servicing technician with indications of whether a particular fault is new, or old, or intermittent. Further, the inventors herein contend that relatively sophisticated external microcomputer programming is required to infer a particular fault type from the prior devices. These disadvantages are particularly severe in a modern automobile environment having numerous electronically actuated devices and complex electrical interconnections or cabling. Accordingly, service technicians commonly replace allegedly defective components which are actually not defective. Further, technicians are often unable to repair intermittent failures.

SUMMARY OF THE INVENTION

It is therefore an object of the present invention to provide an electronic switching module with fault detection including detection of intermittent faults.

The above and other disadvantages are overcome, and object achieved, by providing both an apparatus and method for determining faulty operation in an electronic power driver coupled to an electronically actuated device. In one particular aspect of the invention, the method comprises the steps of: generating test intervals; actuating the power driver for a predetermined time during each of the test intervals; sampling an electrical power output of the driver during each of the self test intervals; and determining from the sampling step whether there is a new fault indication which did not occur during a previous one of the test intervals. An advantage is thereby obtained of providing accurate indications of intermittent faults which was not heretofore possible.

In another aspect of the invention, the apparatus comprises: at least one switching means responsive to an actuating signal for coupling electrical power to a load, the switching means including monitoring means for monitoring a plurality of electrical operating parameters of the switching means and for providing a corresponding plurality of fault type indications, the monitoring means also latching each of the plurality of fault type indications as they occur; sampling means for periodically sampling the plurality of fault type indications from the switching means; detection means responsive to the sampling means for providing an indication of when each of the plurality of fault type indications is a new fault; and formatting means for providing an indication of fault type for each of the switching means and also providing an indication of intermittent fault operation.

The above aspect of the invention provides an advantage of accurately determining intermittent operation. Another advantage provided is that an indication of each fault type and the number of times each such type occurred is provided thereby aiding the service technician in accurately locating and repairing the fault condition.

DESCRIPTION OF THE DRAWINGS

The objects and advantages described herein are better understood by reading the following description of an example of an embodiment in which the invention is used to advantage, referred to herein as the Description of the Preferred Embodiment, with reference to the drawings wherein.

DESCRIPTION OF THE PREFERRED EMBODIMENT

Figures 1A, 1B, 1C:
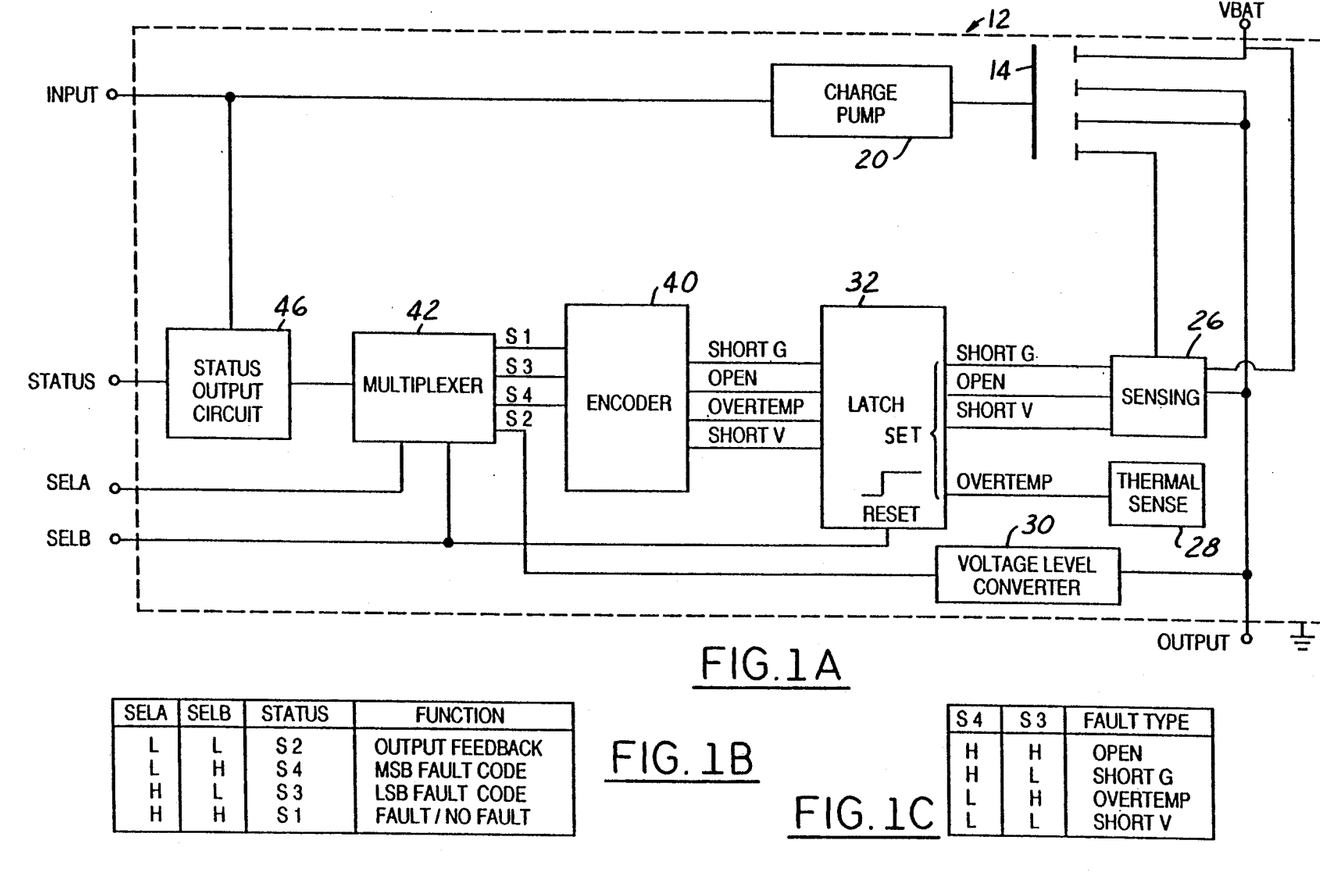
FIG. 1A is a block diagram of a power switching module in which the invention is used to advantage.
FIG. 1B is a table of various status outputs of the embodiment shown in FIG. 1A.
FIG. 1C is a table showing how the status output is encoded by the switching module shown in FIG. 1A to provide the exact fault type.

Referring first to FIG. 1, a block diagram of smart power driver 12 including temperature operating monitors is shown. Field effect transistor (FET) 14 is shown having output electrodes coupled between a voltage source (VBAT) and an output pin for applying power to a load (such as a fuel injector shown in FIG. 2). Charge pump 20 is shown actuating the gate of FET 14 in response to an input signal. Sensing circuitry 26 is shown coupled to FET 14 for providing indications of a short to ground, an open, or a short to voltage. This circuitry comprises conventional circuitry well known to those skilled in the art. For example, a short to ground is indicated by providing a sensing resistor (not shown) having a fraction of load current fed therethrough. Voltage comparators (not shown) coupled across the sensing resistor then provide an indication of a short to ground. An open circuit indication is indicated by a voltage comparator (not shown) coupled across the output electrodes of FET 14. Thermal sensing indicates an over temperature condition by monitoring the leakage current through a transistor (not shown) coupled to FET 14. Voltage level converter 30 monitors the voltage drop across the load and in response provides a logic 1 output if the voltage drop is greater than half of VBAT.

Latch 32 is a 4-bit asynchronous latch which individually latches short to ground, open, short to voltage, and over temperature fault conditions as they occur. Encoder 40 encodes the four fault indications into binary bits S3 and S4. The encoding scheme is shown in FIG. 1C. Encoder 40 also provides binary signal S1 having a logic 1 state when any of the four fault indications are present.

Multiplexer 42 receives fault status S1, fault codes S3 and S4, and output feedback S2. As described in greater detail later herein, in response to select A (SELA) and select B (SELB), multiplexer 42 couples either S1, S2, S3, or S4 to status output circuitry 46 which then provides a single buffered output at the status pin. More specifically, the status provided at the status pin is shown in FIG. 1B as a function of SELA and SELB. When SELA is high, and SELB transitions from low to high, a reset pulse is generated to reset latch 32. After the reset pulse, the occurrence of any fault condition will be set into latch 32.

Figure 2:
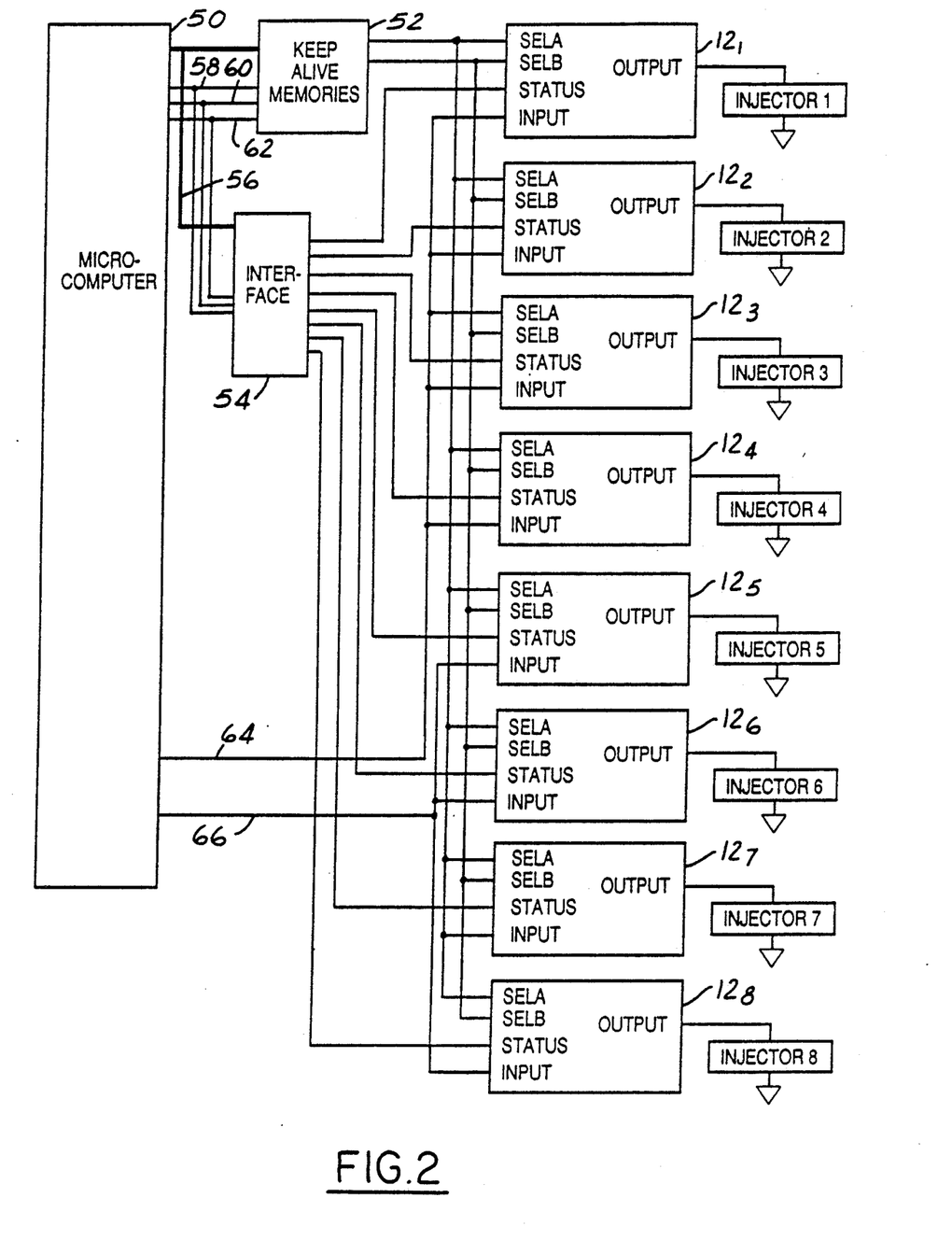
FIG. 2 is a block diagram of a system wherein the embodiment shown in FIG. 1A is used to advantage.

A block diagram illustrating the use of smart power drivers 12 in a fault monitoring system is shown in FIG. 2 wherein like numerals refer to like elements shown in FIG. 1. For the particular example illustrated herein, power drivers $12_{1-8}$ are shown driving respective fuel injectors 1-8. It is noted, however, that the invention described herein may be used to advantage with any number of power drivers 12 driving load other than fuel injectors such as, for example, solenoid valves, electric motors, and relays. The status output from power drivers $12_{1-8}$ are shown coupled to microcomputer 50 and keep alive memories 52 via interface module 54 and busline 56. The structure and operation of keep alive memories 52 is described later herein with particular reference to FIGS. 3 and 4A-4B. Microprocessor 50 is shown communicating with keep alive memories 52 and interface module 54 via conventional data in/out line 58, instruction transfer line 60 and read/write line 62. For the particular example shown herein, microcomputer 50 actuates injectors 1-8 via bank 1 and bank 2 commands on respective lines 64 and 66.

In general terms, which are described in greater detail later herein with particular reference to FIGS. 5 and 6A-6B, there are two basic modes of fault monitoring—a self test mode and a performance monitoring mode. The self test mode occurs each time the ignition key is actuated. The performance monitoring mode continuously occurs during the vehicular operation.

The structure of keep alive memory 52 is now described with reference to FIGS. 3 and 4A-4B. For ease of illustration, the structure of that portion of keep alive memory 52 relating to self test is first described. The portion of keep alive memory 52 relating to the performance monitoring mode is described later herein. With respect to the self test mode, keep alive memory 52 includes injector status flag (ISF) register 70, previous injector status flag (PISF) register 72, injector status flag history (ISFH) register 74, and injector status flag counters (ISFC$_{1-8}$)) 76, 78, 80, 82, 84, 86, 88, and 90. More specifically, ISF 70 is here shown as an 8-bit register wherein the eight output feedback signals S2$_{1-8}$ from respective fuel injectors 1-8 are concurrently stored. For the particular example illustrated herein, the least significant bit position of ISF register 70 stores output feedback signal S2$_1$ from injector 1, and the most significant bit position stores output feedback signal S2$_8$ from injector 8. Previous injector status flag register 72 is shown storing the previous output feedback signals PS2$_{1-8}$ from respective injectors 1-8. Output feedback signals PS2$_{1-8}$ are the eight output feedback signals S2$_{1-8}$ from the previous self test cycle.

ISFH 74 is here shown as an 8-bit register storing a history of eight output feedback fault signals HS2$_{1-8}$ for respective injectors 1-8. During any self test cycle, a fault indication on any of the output feedback signals S2$_{1-8}$ results in a setting of the corresponding one of the HS2$_{1-8}$ signals to a logic 1. Stated another way, whenever any of the HS2$_{1-8}$ signals in register ISFH 74 is a logic 1, an indication is given that the corresponding power driver 12$_{1-8}$ provided a failure indication during a self test interval.

Figure 3:
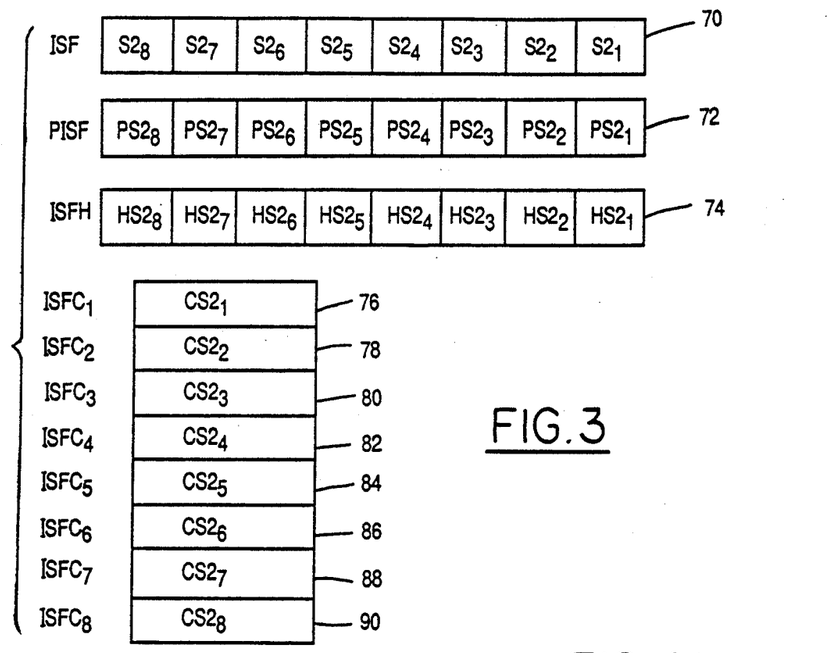
FIG. 3 illustrates various memory locations shown for the system shown in FIG. 2 which are utilized to advantage during self test operations.
Figure 4A:
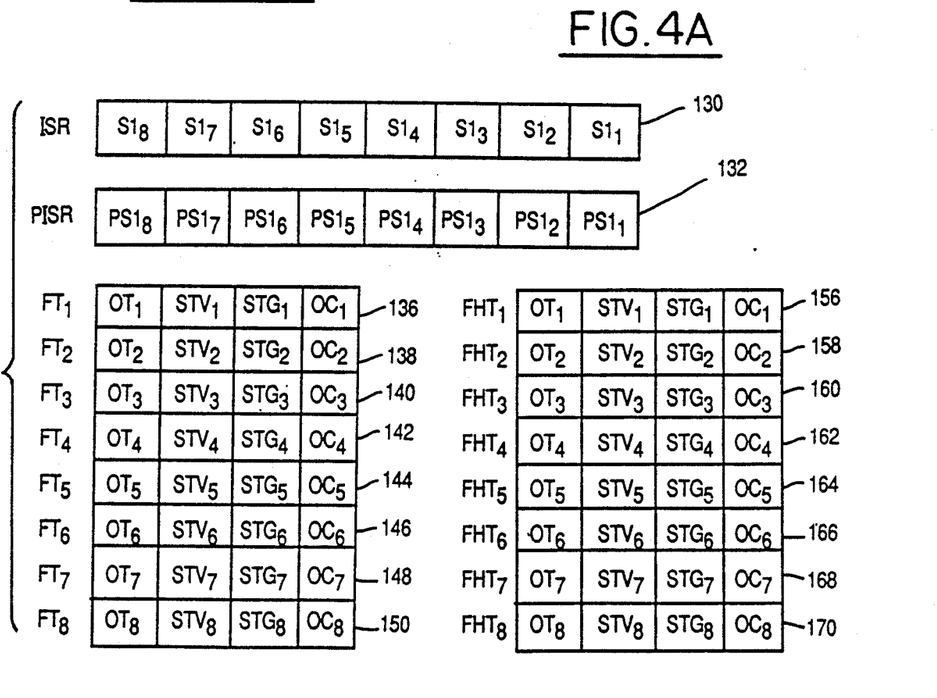
FIGS. 4A and 4B illustrate various memory locations of the system shown in FIG. 2 for storing various fault types during normal operation.

Continuing with FIG. 3, eight injector status fault counters ISFC$_{1-8}$ are shown. These counters are designated in FIG. 3 as ISFC$_1$ 76, ISFC$_2$ 78, ISFC$_3$ 80, ISFC$_4$ 82, ISFC$_5$ 84, ISFC$_6$ 86, ISFC$_7$ 88, and ISFC$_8$ 90. Each counter ISFC$_{1-8}$ counts faults provided by the corresponding power driver 12$_{1-8}$ for each self test cycle. Accordingly, the resultant status flag count CS2$_{1-8}$ from the respective ISFC$_{1-8}$ counter represents the number of times one of the corresponding power drivers 12$_{1-8}$ has provided a failure indication during a self test cycle.

Figure 5:
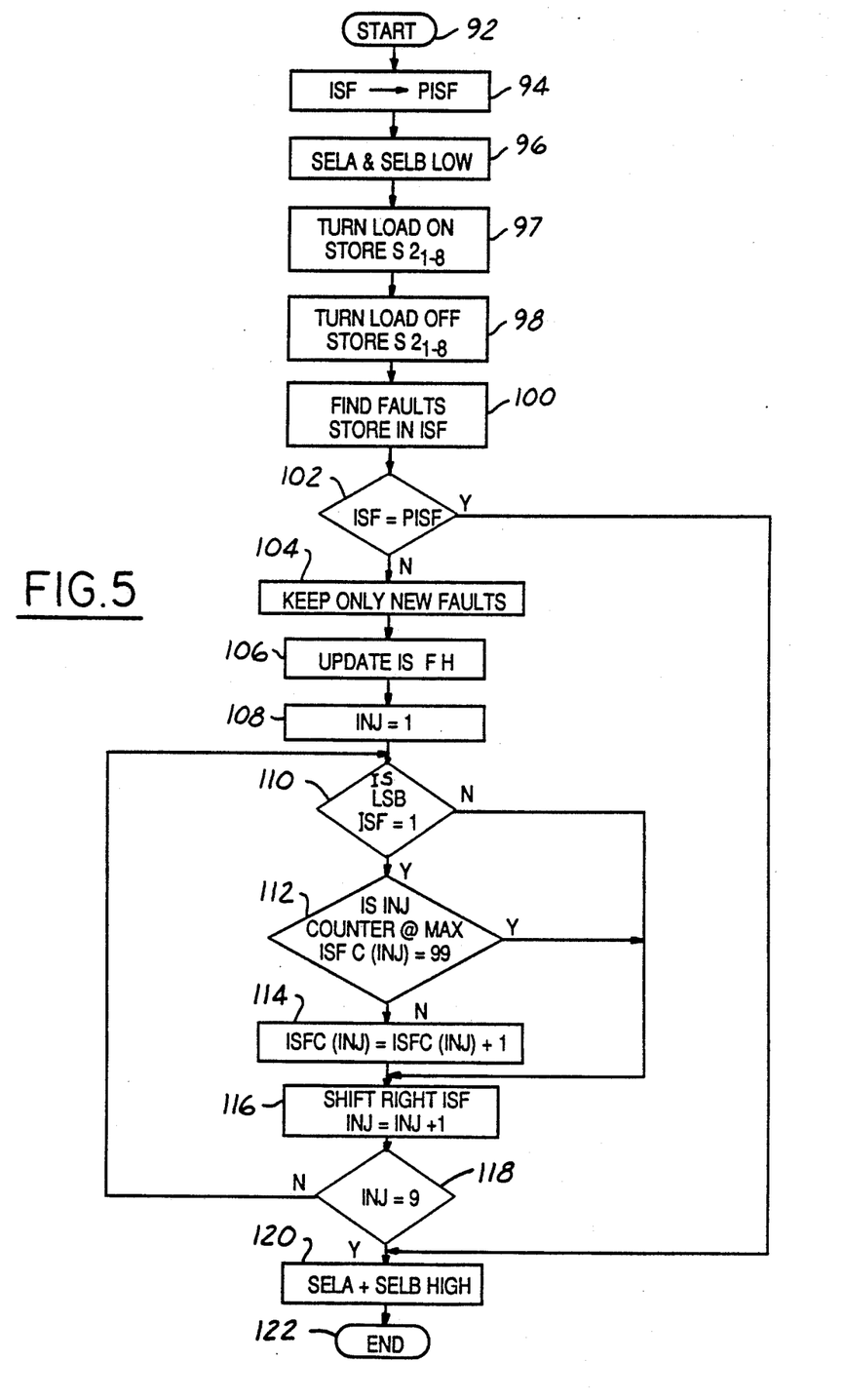
FIG. 5 illustrates various process steps performed by the system illustrated in FIG. 2 during self test operations.

Referring now to FIG. 5, a description of the operation of power drivers 12$_{1-8}$, microcomputer 50, keep alive memories 52, and interface module 54 during the self test mode is now described. The process steps are illustrated via numbered blocks representative of operations sequenced by microcomputer 50.

Start step 92 indicates initiation of a self test cycle in response to operator actuation of the vehicle ignition. The fault contents S2$_{1-8}$ of injector status fault register (ISF) 70 are transferred to previous injector fault status register (PISF) 72 as indicated by step 94. During step 96, SELA and SELB are set low to read output feedback values S2$_{1-8}$ from respective power drivers 12$_{1-8}$. During step 97, power drivers 12$_{1-8}$ apply power to respective injectors 1-8 for a predetermined time period. The resulting output feedback values S2$_{1-8}$, which are proportional to the power actually applied to injectors 1-8, are stored in a temporary storage register (not shown). Each power driver 12$_{1-8}$ then removes power from respective injectors 1-8 and the resulting output feedback values S2$_{1-8}$ are stored in another temporary storage location (see step 98).

During step 100, the "on" and "off" values of $S2_{1-8}$ from each temporary storage location are compared in an exclusive nor operation to determine the presence of any faults. Stated another way, each stored $S2_{1-8}$ value corresponding to the "on" state should be a logic 1, and each stored $S2_{1-8}$ value corresponding to the "off" state should be a logic 0. Otherwise, a fault indication is provided. For each resulting fault indication from a power driver $12_{1-8}$, a logic 1 is stored in a corresponding bit location of register ISF 70. These stored fault values are then updated such that only new fault values (i.e. fault indications which did not occur during a previous self test cycle) remain stored in ISF 70. More specifically, during step 102, each bit of register ISF 70 is compared with the corresponding bit of register PISF 72. Fault indications which existed during previous self test cycle are then removed from register ISF 70 such that only new faults remain as shown by step 104. Similarly, injector status fault history register (ISFH) 106 is updated by a simple logic "or" operation in step 74. Thus, a logic 1 in a particular bit location of register ISFH 74 indicates a fault from the corresponding power driver $12_{1-8}$ was provided during at least one self test interval.

During steps 108, 110, 112, 114, 116, and 118 a determination is made of exactly which power driver $12_{1-8}$ has indicated a new fault, and the corresponding injector status counter ($ISC_{1-8}$) is updated. More specifically, index INJ is first set to 1 and the least significant bit (LSB) of register ISF 70 is compared to a logic 1 as shown by steps 108 and 110. Each affirmative comparison indicates that a new fault has occurred. The corresponding counter $ISFC_{1-8}$ is then checked for its maximum count (99 in this example) and incremented by 1 (see steps 112 and 114).

The next power driver $12_{1-8}$ is then evaluated by shifting register ISF 70 to the right (i.e. towards the least significant bit location) and the injector index INJ is incremented by 1 during steps 116 and 118. A determination is then made as to whether faults associated with all eight power drivers $12_{1-8}$ have been evaluated (step 118) and, if not, steps 110, 112, 114, and 116 are resequenced. When all injectors have been evaluated, SELA and SELB are set high for reading fault/no fault value $S_1$ during the subsequent performance monitoring mode (see steps 120 and 122).

In accordance with the description provided above, at the end of a self test cycle, register ISF 70 contains new fault indications from the last self test cycle, register ISFH 74 contains an indication of whether any fault has occurred during any self test cycle, and counter $ISFC_{1-8}$ contain a count of the number of faults provided by each power driver $12_{1-8}$. Thus, a technician will be informed of failures including intermittent failures which where not heretofore possible. For example, the technician will realize that a fault occurred at some time during a self test interval by examining register ISFH, and then determine that the fault was intermittent by examining the contents of the corresponding fault counter ISFC.

The structure and operation of the performance monitoring mode of operation are now described with reference to the memory structure shown in FIGS. 4A and 4B and the process steps shown in FIG. 6. Referring first to the portions of keep alive memory 52 shown in FIGS. 4A and 4B, injector status register (ISR) 130 is here shown storing the fault/no fault values ($S1_{1-8}$) from respective power driver $12_{1-8}$. The least significant bit location of ISR 130 is shown storing value $S1_1$ from power driver $12_1$ and the most significant bit location is shown storing value $S1_8$ from power driver $12_8$. Previous injector status register (PISR) 132 is shown storing fault/no fault values $PS1_{1-8}$ from the previous performance monitoring cycle.

Eight fault type registers $FT_1$ 136, $FT_2$ 138, $FT_3$ 140, $FT_4$ 142, $FT_5$ 144, $FT_6$ 146, $FT_7$ 148, and $FT_8$ 150 are shown. Each fault type register $FT_{1-8}$ stores the four fault types (1 bit each) from respective power drivers $12_{1-8}$. The four fault types are: over temperature OT, short to voltage STV, short to ground STG, and open circuit OC. Eight fault history registers are also shown: $FHT_1$ 156, $FHT_2$ 158, $FHT_3$ 160, $FHT_4$ 162, $FHT_5$ 164, $FHT_6$ 166, $FHT_7$ 168, and $FHT_8$ 170. Each fault history register $FHT_{1-8}$ stores the fault history of the four fault types from each power driver $12_{1-8}$.

Figure 4B:
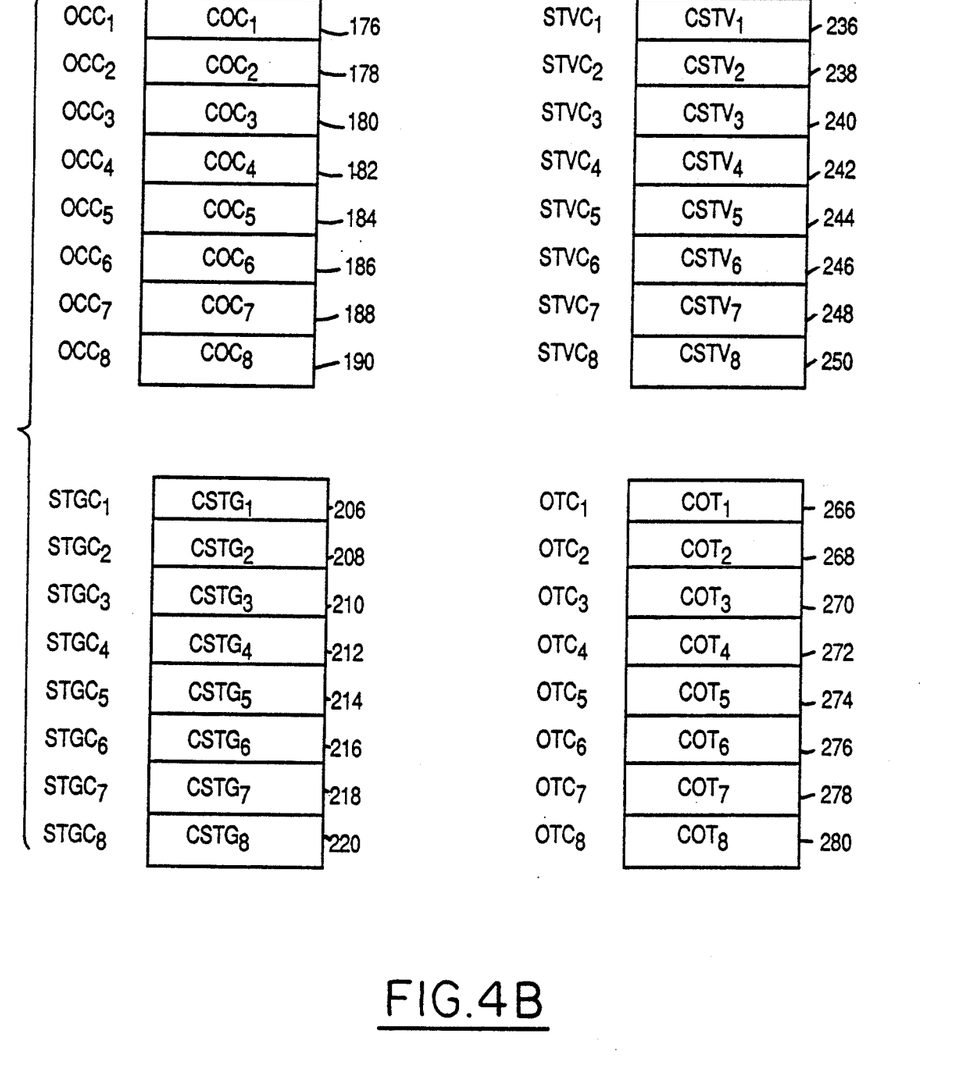

Referring now to FIG. 4B in general terms, each fault type (OC, STG, STV, and OT) is counted in a separate counter corresponding to each power driver. More specifically, eight open circuit counters are shown: $OCC_1$ 176, $OCC_2$ 178, $OCC_3$ 180, $OCC_4$ 182, $OCC_5$ 184, $OCC_6$ 186, $OCC_7$ 188, and $OCC_8$ 190. Each of the $OCC_{1-8}$ counters provides a count of the number of open circuit failures from the corresponding power driver $12_{1-8}$. For example, $COC_1$ represents the count of open circuit failures from power driver $12_1$.

Similarly, eight short to ground counters are shown: $STGC_1$ 206, $STGC_2$ 208, $STGC_3$ 210, $STGC_4$ 212, $STGC_5$ 214, $STGC_6$ 216, $STGC_7$ 218, and $STGC_8$ 220. Each open circuit counter $STGC_{1-8}$ provides a count ($CSTG_{1-8}$) of the number of short to ground failures from the corresponding power driver $12_{1-8}$. Continuing with FIG. 4B, eight short to voltage counters are shown: $STVC_1$ 236, $STVC_2$ 238, $STVC_3$ 240, $STVC_4$ 242, $STVC_5$ 244, $STVC_6$ 246, $STVC_7$ 248, $STVC_8$ 250. Each short to voltage counter $STVC_{1-8}$ counts the number of short to voltage failures ($CSTV_{1-8}$) from respective power drivers $12_{1-8}$. Eight over temperature counters are also shown in FIG. 4B: $OTC_1$ 266, $OTC_2$ 268, $OTC_3$ 270, $OTC_4$ 272, $OTC_5$ 274, $OTC_6$ 276, $OTC_7$ 278, and $OTC_8$ 280. Each over temperature counter $OTC_{1-8}$ provides a count ($COT_{1-8}$) of the number of over temperature failures provided by respective power drivers $12_{1-8}$.

Figure 6A:
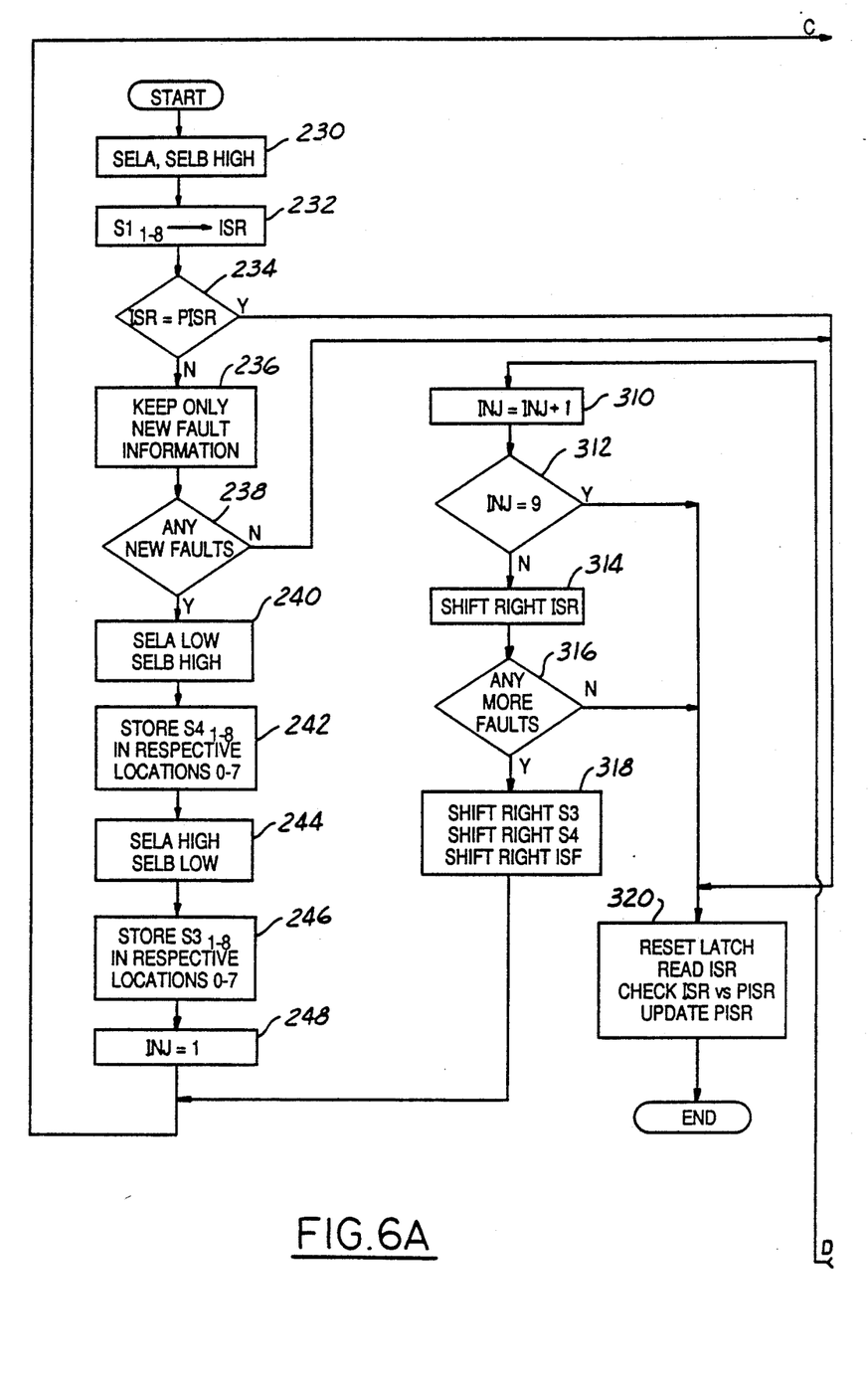
FIG. 6A and 6B illustrate various process steps performed by the system shown in FIG. 2 during normal operations.
Figure 6B:
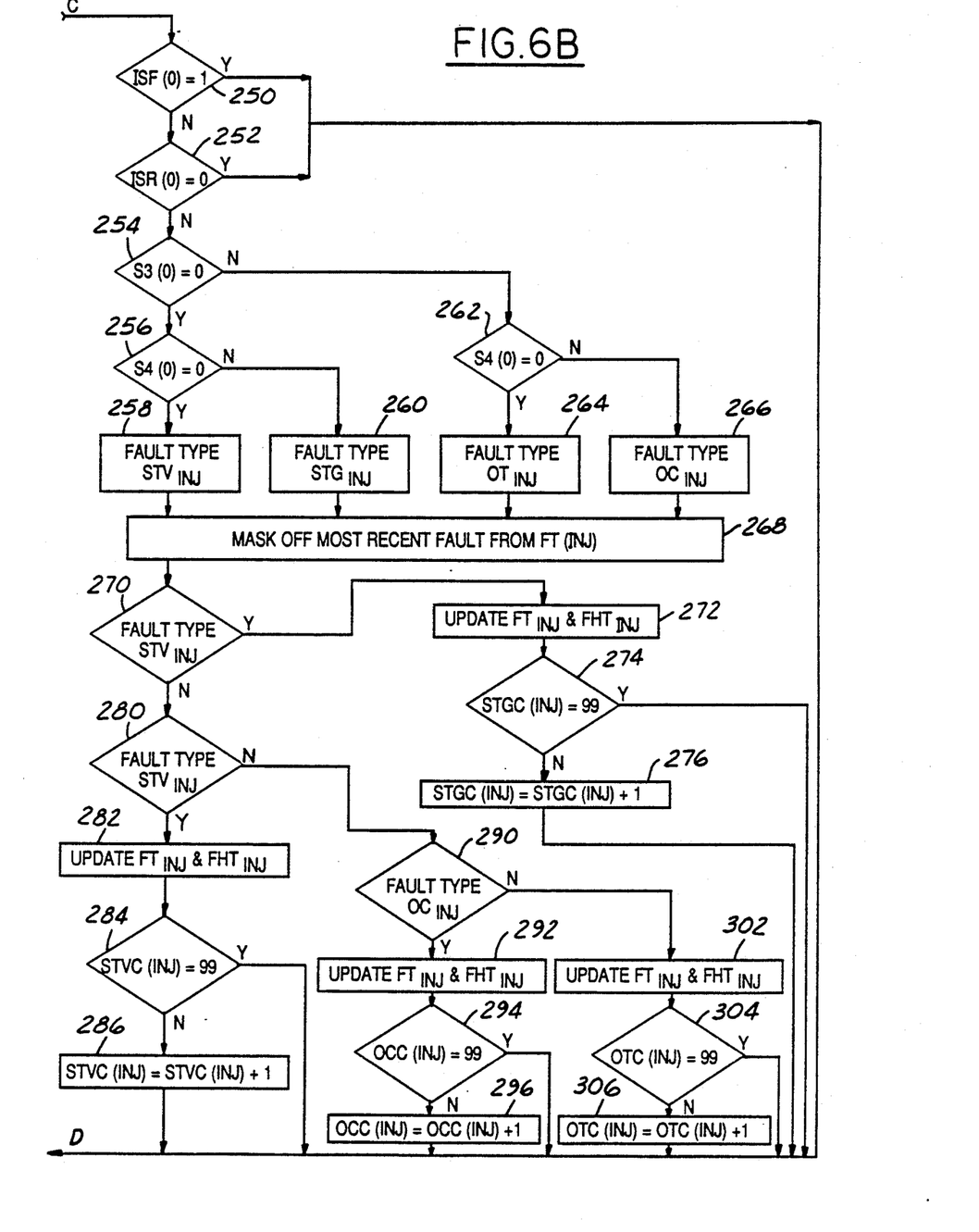

The performance monitoring mode of operation is now described with respect to the process steps sequenced by microcomputer 50 shown in FIGS. 6A & 6B. It is noted that the performance monitoring described herein continues during normal operation of power drivers $12_{1-8}$ such that the outputs $S1_{1-8}$, $S3_{1-8}$, and $S4_{1-8}$ are sampled at predetermined time intervals. Beginning with process step 230, SELA and SELB are set high to read fault/no fault values $S1_{1-8}$ from power drivers $12_{1-8}$. Fault/no fault values $S1_{1-8}$ are stored in appropriate bit locations of injector status register (ISR) 130 during process step 232. ISR 130 is then compared on a bit by bit basis to PISR 132 to determine whether there is any change in fault information (see process step 234). During process step 236 ISR 130 is updated in response to the above comparison such that it contains only new fault information. If any new faults are indicated (see step 238), a determination of the exact fault type is then made during the following process steps. More specifically, during step 240, SELA is set low and SELB is set high to read encoded fault values $S4_{1-8}$ from respective power drivers $12_{1-8}$. Encoded fault values $S4_{1-8}$ are stored in respective bit locations 0-7 of temporary storage register S4R (not shown) as indicated by step 242. SELA is then set high and SELB is then set low during step 244 for reading encoded fault value $S3_{1-8}$ from respective power drivers $12_{1-8}$. In step 246, encoded fault values $S3_{1-8}$ are stored in respective bit locations 0–7 of temporary storage register S3R (not shown).

Injector index INJ is set to 1 in step 248 for initially processing the fault information received from power driver $12_1$. During step 250, the least significant bit of ISF register 70 [ISF(0)] is examined to determine whether there was a self test fault indication during the previous self test cycle. In the event a self test failure is indicated from the particular power driver now being evaluated (power driver $12_1$ in this example), fault type information received from that particular power driver is deemed to be unreliable and, accordingly, a fault type determination is not made (see step 250).

During step 252 the least significant bit location of ISR 130 is evaluated to determine whether the corresponding fault/no fault value $S1_{1-8}$ indicates a fault for the corresponding power driver $12_{1-8}$. If a fault is indicated, then encoded values S3, and S4 are decoded during the subsequent process steps to determine the exact type of fault. More specifically, if both S3 and S4 are low for the particular power driver being evaluated, than the decoded fault type is a short to voltage STV (see steps 254, 256, and 258). When S3 is at a low level and S4 is at a high level for the particular power driver being evaluated, than a short to ground STG is indicated (see steps 254, 256 and 260). When S3 is decoded at a high level, and S4 is decoded at a low level, than an over temperature fault type is indicated for the particular power driver being evaluated (see steps 254, 262, and 264). When S3 and S4 are both decoded at a high level, than an open circuit fault type is indicated for the particular power driver being evaluated (see steps 254, 262, and 266).

For a short to ground STG fault type, the second bit location of fault type register $FT_{1-8}$ and fault history type register $FHT_{1-8}$ are updated for the particular power driver being evaluated (see steps 270 and 272). The short to ground counter for that particular register ($STGC_{1-8}$) is then incremented if that register has not reached its maximum count of 99 (see steps 274 and 276).

As shown by steps 280, 282, 284, and 286 when a short to voltage $STV_{1-8}$ fault type is indicated, the appropriate fault type register ($FT_{1-8}$) and fault history type register ($FHT_{1-8}$) are updated. The short to voltage counter ($STVC_8$) corresponding to the appropriate power driver is also incremented provided it has not reached its maximum count.

Similarly, steps 290, 292, 294, and 296 show the processing when an open circuit ($OC_{1-8}$) fault type is indicated. The fault type counter ($FT_{1-8}$) and fault history type register ($FHT_{1-8}$) associated with the particular power driver being evaluated are updated. The open circuit counter ($OCC_{1-8}$) associated with the power driver being evaluated is incremented provided that counter has not reached its maximum count.

Referring to steps 290, 302, 304, and 306, the process steps associated with an over temperature fault type are shown. More specifically, the fault type register ($FT_{1-8}$) and fault history type register ($FHT_{1-8}$) for the corresponding power driver being evaluated are updated. The corresponding over temperature counter ($OTC_{1-8}$) is also incremented provided that counter has not reached its maximum count.

After the above process steps associated with a particular power driver $12_{1-8}$ are completed, the injector index INJ is incremented by 1 as shown in step 310. In the event all eight power drivers have not been evaluated, ISR 130 is shifted to the right 1 bit such that fault types associated with the next power driver are evaluated (see steps 312 and 314). If any additional faults are indicated (see step 316), the storage registers for encoded fault type S3 (S3R), storage register (S4R) for encoded fault type S4, and ISF 70 are shifted towards the right by 1 bit (see step 318). The process steps beginning with step 250 are then repeated. After all processing is completed, latch 32 of power drivers $12_{1-8}$ are reset by a positive transition of SELB. To determine whether any additional faults occurred during the above processing, ISR 130 is read and compared to PISR 132. If no additional faults occurred during processing, PISR 132 is updated with the new fault values found in ISR 130 and this particular performance monitoring cycle is ended.

Figure 7:
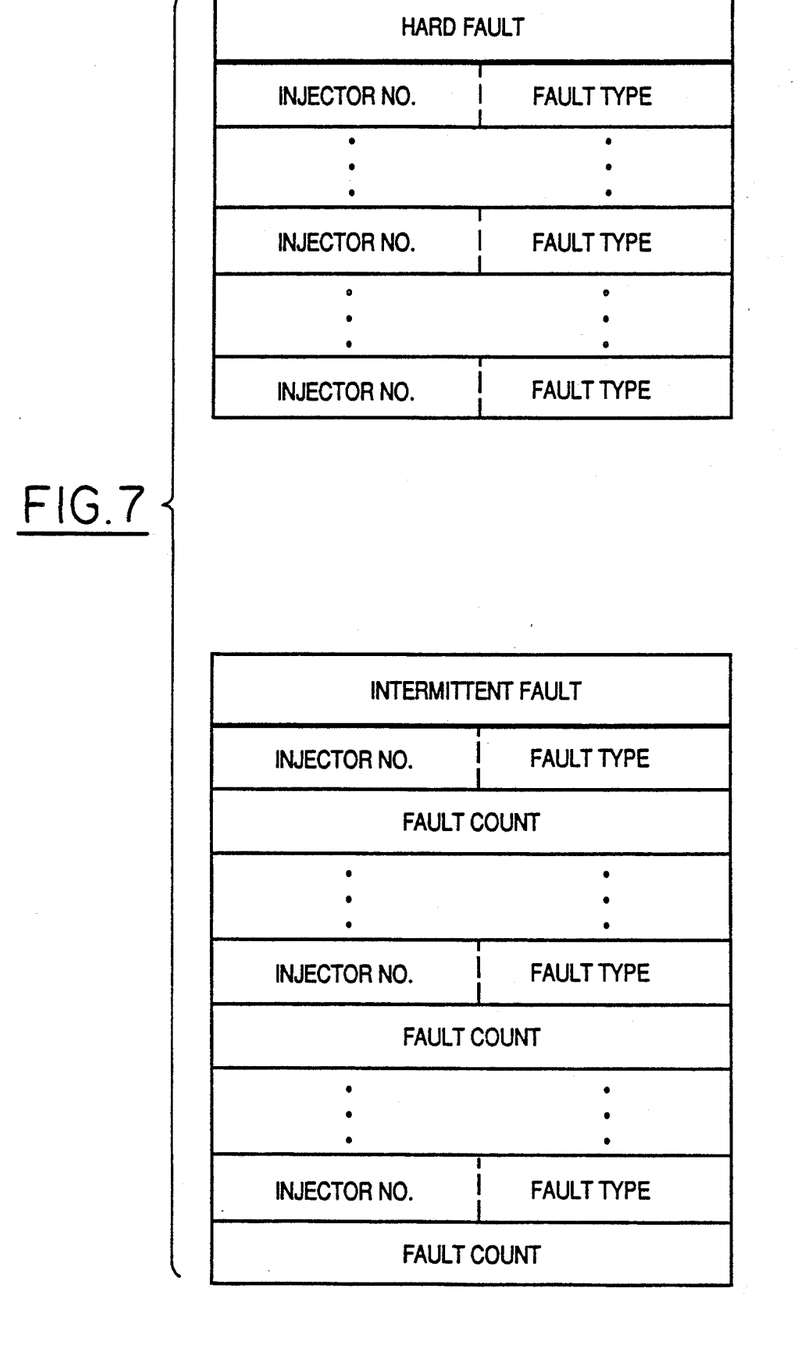
FIG. 7 illustrates the output format of the system shown in FIG. 2.

The information provided by the registers and counters described above provide a technician with sufficient information to determine whether each injector is intermittent, or permanently failed (hard failure), the exact type of failures, and number of intermittent failures. The technician is further aided by the output format described hereinbelow with particular reference to FIG. 7 and FIGS. 8A–8B. In general, FIGS. 8A–8B describe the various process steps performed by microcomputer 50 to develop output formatting which is particularly user friendly. FIG. 7 describes the output format display available on optional external test display 350.

Referring first to FIG. 7, an example of an output format is shown. Information is first roughly divided as hard fault information or intermittent information. For hard fault information, each faulty injector is displayed and the type of faults (i.e. STG, STVC, OT, and OC) diagnosed for each injector is also displayed. For intermittent faults, the injector, fault types, and fault count for each fault type is displayed. It should be noted that an injector may have more than one fault type.

Figure 8A:
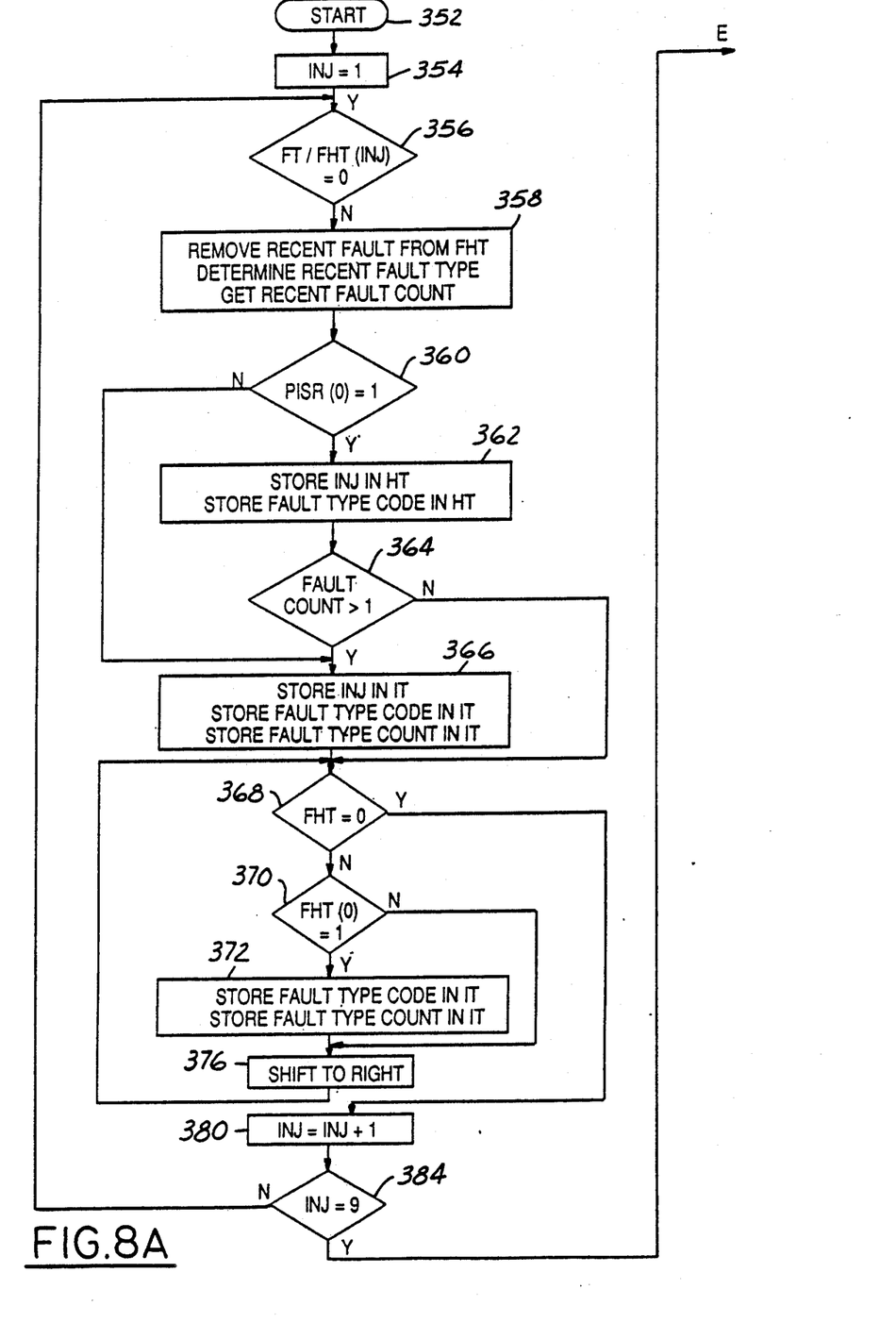
FIGS. 8A and 8B illustrate various process steps for performing the output formatting shown in FIG. 7.
Figure 8B:
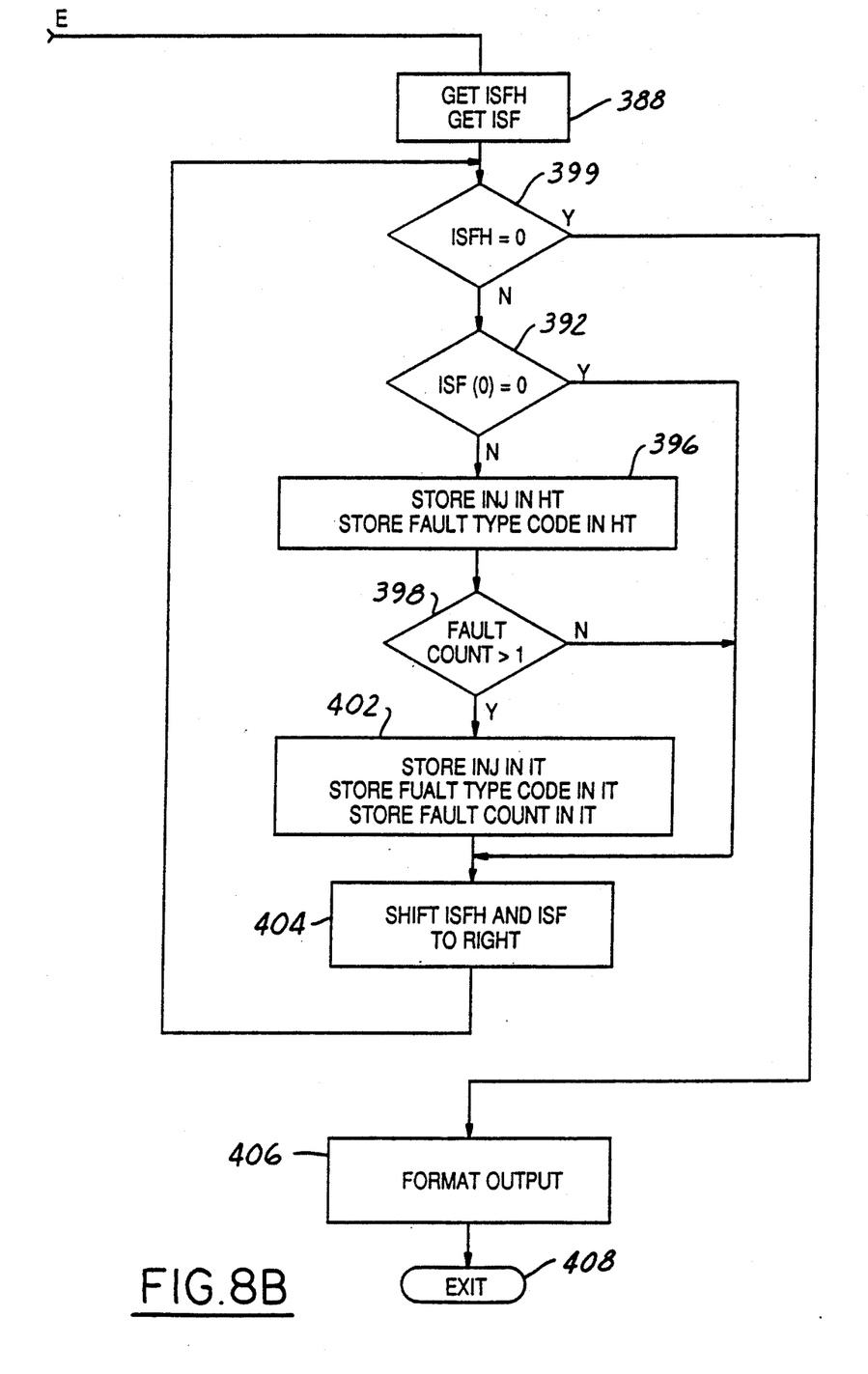

Referring now to FIGS. 8A–8B, the process steps performed by microcomputer 50 for providing the output formatting shown in FIG. 7 is now described. After start of formatting, the appropriate $FT_{1-8}$ register and $FHT_{1-8}$ register corresponding to the injector being evaluated are examined for faults (see steps 352, 354, and 356). As shown by step 358, if any faults exist, the most recent fault is removed from FHT such that any remaining fault indication is intermittent. Each fault type (OT, STV, STG, and OC) is than determined from FHT storage and the corresponding fault count retrieved from the appropriate counter (OTC, STVC, STGC, and OCC). PISR 130 is then checked at the bit location corresponding to the injector evaluated (see step 360). As shown in step 362, if any previous injector status faults are indicated, the appropriate injector number and fault type are stored in a hard fault table (HT). A check of the corresponding fault count is also made (see step 364). Since these are counts of faults which did not occur during the previous cycle, any fault count greater than 1 is an indication of an intermittent fault. Accordingly, the corresponding injector number, fault type, and fault count are stored in the intermittent table (IT) as shown in step 366.

During steps 368, 370, 372, 376, and 380, FHT is checked. Since FHT was modified to contain only intermittent faults as described above, corresponding fault types and counts are stored as intermittent faults in IT. As indicated by step 384, the above steps are resequenced for all eight injectors. Afterwards, self test fault information is formatted as described below.

During steps 388, 390, and 392, the bit location of ISF 70 corresponding to the injector being evaluated is checked for fault indications. If a fault has occurred, the corresponding injector number and fault type are stored in HT (see step 396). During step 398, the fault count from the corresponding $ISFC_{1-8}$ register is checked. In response to a fault count greater than one, the corresponding injector number, fault type, and fault count are stored in IT (see step 402). The above steps are repeated until ISF 70 is fully evaluated and the IT and HT table contents are than read out (see steps 404, 406, and 408) in the format described with reference to FIG. 7.

This concludes the Description of the Preferred Embodiment. The reading of it by those skilled in the art will bring to mind many alterations and modifications without departing from the spirit and scope of the invention. For example, any number of switching modules may be used in a system for actuating loads other than the fuel injectors shown in this example. Accordingly, it is intended that the scope of the invention be limited only by the following claims.

What is claimed is:

1. An apparatus for determining fault operation in systems which couple electrical power to actuators within a motor vehicle, comprising:

power driver means mounted on a module having a signal input pin, a status output pin, and a status input pin, said power driver means including switching means responsive to application of electrical energy to said signal input pin for the coupling of electrical power to the actuator, said power driver means including monitoring means for monitoring a plurality of electrical operating parameters of said switching means and for providing a corresponding plurality of fault type indications to said status output pin in response to application of a first sampling signal to said status input pin, said monitoring means also including feedback means for providing a proportion of the coupled electrical power to said status output pin in response to application of a second sampling signal to said status input pin;

performing monitoring means for periodically sampling said plurality of fault type indications from said status output pin upon applying said first sampling signal to said status input pin during vehicular operation and providing corresponding output indications; and self test means for generating a self test mode upon initial vehicle key on and providing said second sampling signal to said status input pin, said self test means providing an electrical self test signal to said signal input pin for a predetermined time insufficient to actuate the actuator during said self test mode, said self test means storing electrical power occurring at said status output pin during said predetermined time in a first storage location and storing electrical power occurring at said status output pin after said predetermined time in a second memory location, said self test means subsequently providing an exclusive nor comparison of said first memory location to second memory location to provide a self test fault indication and providing a corresponding self test output indication.

2. The apparatus recited in claim 1 wherein said switching means includes a switching transistor.

3. The apparatus recited in claim 1 wherein said switching means comprises a field effect transistor.

4. The apparatus recited in claim 1 wherein said fault type indications are selected from a group comprising: a short to ground indication, an over temperature indication, a short to voltage indication, and an open circuit indication.

* * * * *